United States Patent
Kumar et al.

(10) Patent No.: US 9,337,140 B1
(45) Date of Patent: May 10, 2016

(54) SIGNAL BOND WIRE SHIELD

(71) Applicant: FREESCALE SEMICONDUCTOR, INC., Austin, TX (US)

(72) Inventors: Shailesh Kumar, Noida (IN); Rishi Bhooshan, Ghaziabad (IN); Meng Kong Lye, Shah Alam (MY); Sumit Varshney, Noida (IN); Chetan Verma, Noida (IN)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 0 days.

(21) Appl. No.: 14/842,816

(22) Filed: Sep. 1, 2015

(51) Int. Cl.
*H01L 23/495* (2006.01)
*H01L 23/522* (2006.01)
*H01L 23/00* (2006.01)

(52) U.S. Cl.
CPC ........ *H01L 23/5225* (2013.01); *H01L 23/4952* (2013.01); *H01L 24/85* (2013.01); *H01L 2924/30105* (2013.01)

(58) Field of Classification Search
CPC ................... H01L 23/552; H01L 2224/48253; H01L 2924/3011; H01L 2924/3025; H01L 23/4952; H01L 24/85
USPC .................................................. 257/666, 784
See application file for complete search history.

(56) References Cited

U.S. PATENT DOCUMENTS

| | | | |
|---|---|---|---|
| 5,276,352 A * | 1/1994 | Komenaka | H01L 23/49541 257/666 |
| 5,359,222 A | 10/1994 | Ikemizu | |
| 5,442,228 A | 8/1995 | Pham | |
| 5,869,898 A | 2/1999 | Sato | |
| 5,976,915 A | 11/1999 | Ma | |
| 6,166,429 A | 12/2000 | Ishida et al. | |
| 6,515,870 B1 | 2/2003 | Skinner | |
| 6,538,336 B1 | 3/2003 | Secker | |
| 7,002,249 B2 | 2/2006 | Duffy | |
| 7,211,471 B1 | 5/2007 | Foster | |
| 7,582,951 B2 | 9/2009 | Zhao | |
| 7,875,963 B1 * | 1/2011 | Kim | H01L 23/49503 257/666 |
| 7,928,542 B2 * | 4/2011 | Lee | H01L 23/3107 257/666 |
| 8,003,443 B2 | 8/2011 | Punzalan et al. | |
| 8,283,757 B2 | 10/2012 | Chen | |
| 8,525,310 B2 * | 9/2013 | Chen | H01L 23/49503 257/676 |
| 8,558,398 B1 | 10/2013 | Seetharam | |
| 8,791,582 B2 | 7/2014 | Lee | |
| 8,890,298 B2 | 11/2014 | Buer | |
| 2005/0121752 A1 | 6/2005 | Lee | |
| 2008/0116553 A1 | 5/2008 | Rossi | |
| 2008/0290483 A1 | 11/2008 | Yurino | |
| 2010/0013109 A1 * | 1/2010 | Chen | H01L 22/32 257/786 |
| 2011/0111562 A1 | 5/2011 | San Antonio | |
| 2012/0211903 A1 | 8/2012 | Kawase | |
| 2012/0256305 A1 | 10/2012 | Kaufmann | |
| 2013/0082371 A1 | 4/2013 | Chen | |

* cited by examiner

*Primary Examiner* — Nitin Parekh
(74) *Attorney, Agent, or Firm* — Charles E. Bergere

(57) ABSTRACT

A semiconductor device includes a semiconductor die having opposing first and second main surfaces, contact pads and a metal ring accessible from the first main surface, and signal leads surrounding and spaced from the die. Each of the signal leads has a first end near the die, a second end remote from the die, and a body extending between the first and second ends. A dummy lead frame is disposed between the signal leads first ends and the die, and connected to a fixed potential. First bond wires are coupled to respective ones of the signal leads and the contact pads. Second, shield bond wires, located adjacent to respective ones of the bond wires, are coupled to the dummy lead frame and the metal ring.

8 Claims, 1 Drawing Sheet

SIGNAL BOND WIRE SHIELD

BACKGROUND

The present invention is directed to shielding effects in semiconductor devices and, more particularly, to shielding signal bond wires in mixed signal integrated circuit devices.

The increasing frequency of use of digital and mixed-analog SOCs (System on a Chip) is resulting in a corresponding increase in electromagnetic compatibility (EMC) radiation. The SOCs affect nearby devices or are adversely impacted by other devices in the vicinity. For example, signal bond wires extending from device signal leads to contact pads on the SOC die are susceptible to noise coupling, both as sources and recipients.

It is therefore desirable to implement a shield that can reduce the noise effects on the signals traversing the bond wires of the SOC.

BRIEF DESCRIPTION OF THE SEVERAL VIEWS OF THE DRAWINGS

The present invention is illustrated by way of example and is not limited by embodiments thereof shown in the accompanying figures, in which like references indicate similar elements. Elements in the figures are illustrated for simplicity and clarity and have not necessarily been drawn to scale. Notably, certain vertical dimensions have been exaggerated relative to certain horizontal dimensions.

In the drawings.

DETAILED DESCRIPTION

In one embodiment, the present invention provides a semiconductor device including a semiconductor die having opposing first and second main surfaces. The semiconductor die includes a plurality of contact pads and a metal ring accessible from the first main surface. A plurality of signal leads are spaced apart from the semiconductor die. Each of the plurality of signal leads includes a first end located proximate the semiconductor die, a second end located remotely from the semiconductor die, and a body extending between the first and second ends. One or more dummy lead frames are disposed between the first ends of the signal leads and the semiconductor die. The dummy lead frames are connected to a fixed potential. Each of a plurality of signal bond wires is coupled to a respective one of the plurality of signal leads and to a respective one of the contact pads. Each of a plurality of shield bond wires is coupled to one of the one or more dummy lead frames and to the metal ring. In a preferred embodiment the shield bond wires are adjacent to and extend substantially parallel with respective ones of the signal bond wires.

In another embodiment, the present invention provides a method of assembling a semiconductor device. The method includes providing a semiconductor die having opposing first and second main surfaces, wherein the die has a plurality of contact pads and a metal ring on its first main surface, and providing a plurality of signal leads spaced apart from the semiconductor die. Each of the signal leads includes a first end located proximate the semiconductor die, a second end located remotely from the semiconductor die, and a body extending between the first and second ends. The method further includes providing one or more dummy lead frames between the first ends of the signal leads and the semiconductor die, and attaching a plurality of signal bond wires, each of which is coupled to a respective one of the signal leads and to a respective one of the contact pads. The method further includes attaching a plurality of shield bond wires, each of which is coupled to one of the one or more dummy lead frames and to the metal ring, and connecting the one or more dummy lead frames to a fixed potential. In a preferred embodiment the shield bond wires are adjacent to and extend substantially parallel with respective ones of the signal bond wires.

Figure 1:
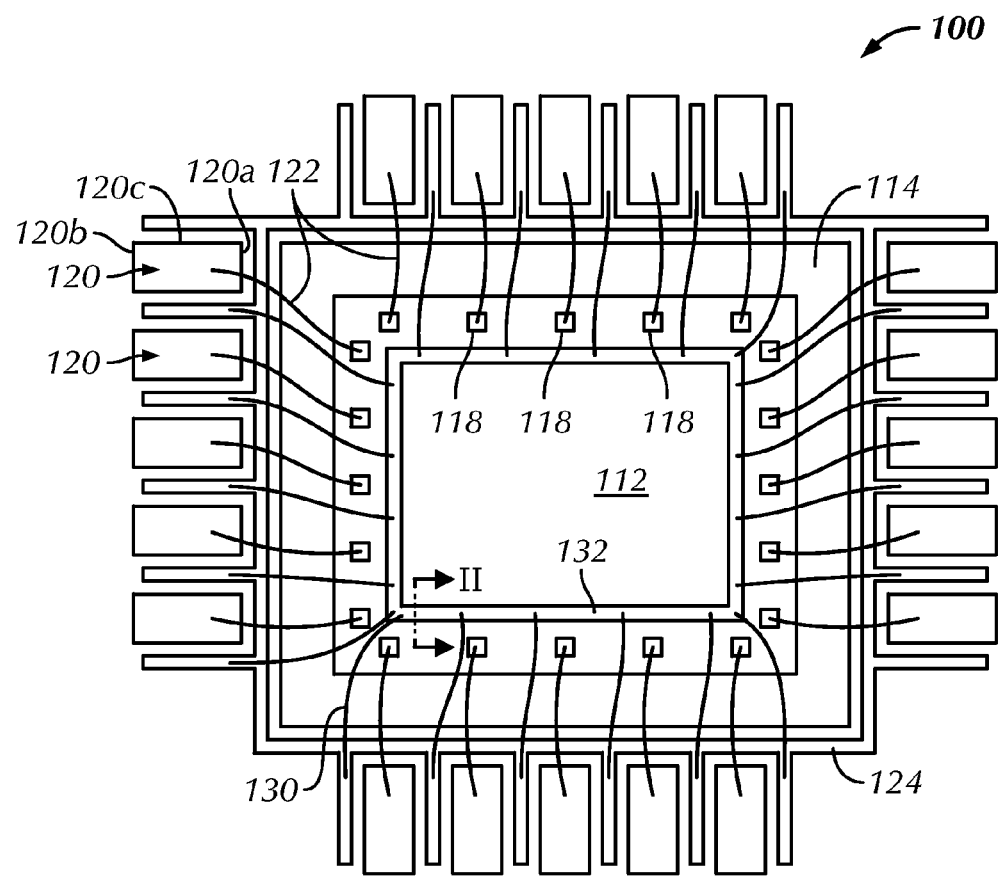
FIG. 1 is a top plan view of a semiconductor device in accordance with a preferred embodiment of the present invention.
Figure 2:
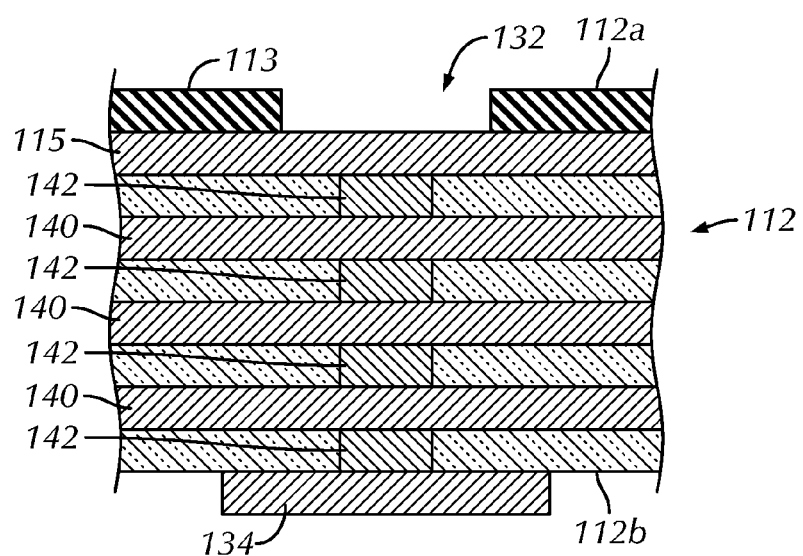
FIG. 2 is a partial cross-sectional side elevational view of the semiconductor device of FIG. 1 taken along line II.

Referring now to the drawings, wherein the same reference numerals are used to designate the same components throughout the several figures, there is shown in FIGS. 1 and 2 an embodiment of a semiconductor device 100 in accordance with the present invention. The semiconductor device 100 includes a semiconductor die 112 that is typically in the form of an integrated circuit (IC) or the like. The semiconductor die 112 may be made from any semiconductor material or combinations of materials, such as gallium arsenide, silicon germanium, silicon-on-insulator (SOI), silicon, monocrystalline silicon, the like, and combinations of the above. Further, the die 112 may implement various types of circuits, such as a processor, a controller, or the like, although it is preferred that the die 112 implements an SOC. The semiconductor die 112 may further be mounted on a die flag 114, which, as is conventionally known, may provide structural support and/or electrical connections for the semiconductor die 112.

The semiconductor die 112 includes opposing first and second main surfaces 112a, 112b. The first main surface 112a is preferably formed by a passivation layer 113. The passivation layer 113 may be a thin layer of nitride, although other types of dielectric materials, such as oxides or the like, may be used as well. Beneath the passivation layer 113 is preferably an aluminum cap layer 115, which is preferably patterned over lower metal layers embedded in the semiconductor die 112. While the preferred material for the cap layer 115 is aluminum, other conductive materials, such as copper, gold, or the like, or combinations thereof, may be used as well. The aluminum cap layer 115 may be patterned and formed of a series of isolated traces or bodies coupled to various electrical connection points in the semiconductor die 112.

The semiconductor die 112 preferably includes a plurality of contact pads 118 on its first main surface 112a. The contacts pads 118 are preferably made from a conductive material, such as gold or the like, and may be disposed on the first main surface 112a of the semiconductor die 112, or are embedded within the semiconductor die 112 and partially exposed at the surface 112a, preferably through the passivation layer 113. Portions of the aluminum cap layer 115 may cover or be part of the contact pads 118 as well. The contact pads 118 are preferably reserved for receiving I/O signals, power signals, or the like.

The semiconductor device 100 further preferably includes a plurality of signal leads 120 to which the semiconductor die 112 is electrically connected via the contact pads 118. Each of the signal leads 120 is preferably made from a conductive material, such as copper, aluminum, or the like. The plurality of signal leads 120 may also be coated, alloyed, or pre-plated with a metal layer or layers such as silver, gold, nickel, palladium, tin, or the like. However, other materials may be used for the signal leads 120. The number and shapes of the signal leads 120 may be varied as necessary depending on the end use configurations and other such factors.

In particular, each signal lead 120 preferably has a first end 120a located proximate the semiconductor die 112, a second end 120b located remotely from the semiconductor die 112, and a body 120c extending between the first and second ends 120a, 120b. As shown in FIG. 1, the signal leads 120 preferably surround a periphery of the semiconductor die 112 in a rectangular shape, although other configurations may be used as well, depending on size requirements, the shape of the semiconductor die 112, and other like factors. As will be understood by those of skill in the art, the flag 114 and leads 120 may be parts of a conventional lead frame.

A plurality of signal bond wires 122 is used to electrically couple the signal leads 120 to respective ones of the contact pads 118 of the semiconductor die 112. The signal bond wires 122 can be attached using a conventional wire bonding process. The signal bond wires 122 are preferably in the form of gold or copper wires, although other materials may be used. While wires are the preferred structure, other electrical connection methods are also contemplated.

One or more dummy lead frames 124 are disposed between the first ends 120a of the signal leads 120 and the semiconductor die 112. The dummy lead frame 124 is preferably made from a conductive material, such as copper, aluminum, or the like, and may be coated, alloyed, or pre-plated. More preferably, the dummy lead frame 124 is made from the same material as the signal leads 120. While a single dummy lead frame 124 is shown in FIG. 1 as having branches that extend along all four sides of the semiconductor die 112, portions of the dummy lead frame 124 may be separated into multiple, discrete parts corresponding to different sides of the semiconductor die 112, individual or sets of signal leads 120, or the like. The dummy lead frame 124 preferably extends at least partially along the bodies 120c of the signal leads 120 as well, as shown in FIG. 1.

The one or more dummy lead frames 124 are also preferably connected to a fixed potential for the purpose of providing shielding of the signal leads 120. In preferred embodiments, the fixed potential is simply ground, although other potentials can be used as well, depending on the application and the voltages applied to the signal leads 120 and the semiconductor die 112.

The semiconductor device 100 further includes a plurality of shield bond wires 130 that couple the dummy lead frame 124 to the semiconductor die 112, thereby providing shielding and improving noise performance for the signal bond wires 122. Specifically, the semiconductor die 112 preferably includes a metal ring 132 that is accessible from the first main surface 112a of the semiconductor die 112, and to which the shield bond wires 130 are connected. More particularly, the metal ring 132 may be formed by an opening in the passivation layer 113, and can include the aluminum cap layer 115, which is exposed by the opening in the passivation layer 113. However, other methods for providing a metal ring 132, and other materials, may be utilized in keeping with the present invention.

The metal ring 132 is preferably in the shape of a rectangle, with each side running parallel to a corresponding side of the semiconductor die 112, as shown in FIG. 1. However, other shapes for the metal ring 132 may be used, as desired. By providing a metal ring 132, as opposed to individual pads for the shield bond wires 130, flexibility is achieved in bonding sites, allowing the shield bond wires 130 to be placed in optimum locations for noise prevention.

The metal ring 132 may be connected through the semiconductor die 112 to a ring contact 134 on the second main surface 112b of the semiconductor die 112. The connection may be direct, using a single via or the like, or as shown in FIG. 2, the metal ring 132 may be connected to the ring contact 134 using one or more intermediate metal layers 140 and corresponding vias 142 in the semiconductor die 112.

The shield bond wires 130 can be attached using a conventional wire bonding process. The shield bond wires 130 are preferably in the form of gold or copper wires, although other materials may be used. While wires are the preferred structure, other electrical connection methods are also contemplated. In a preferred embodiment the shield bond wires are adjacent to and extend substantially parallel with respective ones of the signal bond wires. Thus, in a preferred embodiment, each signal bond wires 122 will have a shield bond wire 130 on at least one side that extends substantially parallel to the signal bond wire 122. In another preferred embodiment, the signal bond wires 122 will have a shield bond wire 130 on each side thereof and extending substantially parallel thereto. Of course, as will be understood by those of skill in the art, not all of the signal bond wires will require shielding so some of the signal bond wires 122 will not have any adjacent shield bond wires 130.

The semiconductor device 100 preferably may further include a package casing (not shown) that encapsulates the semiconductor die 112 and portions of the signal leads 120, as is conventionally known. The package casing is preferably formed from a mold compound, such as a ceramic material, a polymeric material, or the like, as is known in the art.

A method of assembling the semiconductor device 100 shown in FIG. 1 will now be described. First, the semiconductor die 112 is provided. The die 112 includes the contact pads 118 and the metal ring 132. The metal ring 132 can be formed by welding, soldering, deposition, plating, or other like techniques for attachments, or by etching or polishing of the first main surface 112a of the semiconductor die 112 to expose one of the underlying metal layers of the die 112.

The signal leads 122 are provided spaced-apart from the semiconductor die 112. This is accomplished typically through provision of a lead frame (not shown) containing all of the necessary leads. The one or more dummy lead frames 124 can also be provided as part of the same lead frame as the signal leads 122, or may be provided separately.

The signal leads 122 are electrically connected to respective ones of the contact pads 118, preferably using a wire bonding process. The dummy lead frames 124 are similarly connected to the metal ring 132 with the shield bond wires 130 using a wire bonding process. The dummy lead frames 124 are also connected to the fixed potential, which preferably occurs following the attachment of the shield bond wires 132, but can occur earlier, if practical. It will be understood by those of skill in the art that attaching the signal bond wires and the shield bond wires can be performed in the same step using a conventional wire bonding apparatus.

In the foregoing specification, the invention has been described with reference to specific examples of embodiments of the invention. It will, however, be evident that various modifications and changes may be made therein without departing from the broader spirit and scope of the invention as set forth in the appended claims.

Those skilled in the art will recognize that boundaries between the above-described operations are merely illustrative. The multiple operations may be combined into a single operation, a single operation may be distributed in additional operations and operations may be executed at least partially overlapping in time. Further, alternative embodiments may include multiple instances of a particular operation, and the order of operations may be altered in various other embodiments.

The terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

In the claims, the word 'comprising' or 'having' does not exclude the presence of other elements or steps then those listed in a claim. Further, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The fact that certain measures are recited in mutually different claims does not indicate that a combination of these measures cannot be used to advantage.

The invention claimed is:

1. A semiconductor device, comprising:
    a semiconductor die having opposing first and second main surfaces, the semiconductor die including a plurality of contact pads and a metal ring accessible from the first main surface;
    a plurality of signal leads spaced apart from the semiconductor die, each of the signal leads including a first end located proximate the semiconductor die, a second end located remote from the semiconductor die, and a body extending between the first and second ends;
    one or more dummy lead frames disposed between the first ends of the signal leads and the semiconductor die, the one or more dummy lead frames being connected to a fixed potential;
    a plurality of signal bond wires coupled to respective ones of the plurality of signal leads and a respective one of the contact pads; and
    a plurality of shield bond wires coupled to one of the one or more dummy lead frames and the metal ring,
    wherein the metal ring is connected through the semiconductor die to a ring contact on the second main surface of the semiconductor die.

2. The semiconductor device of claim 1, wherein the metal ring is formed by an opening in a passivation layer on the first main surface of the semiconductor die.

3. The semiconductor device of claim 2, wherein the metal ring includes an aluminum cap layer that is exposed through the passivation layer.

4. The semiconductor device of claim 1, wherein the shield bond wires are located adjacent and extend substantially parallel with respective ones of the signal bond wires.

5. The semiconductor device of claim 1, wherein the one or more dummy lead frames extend partially along the bodies of the plurality of signal leads.

6. The semiconductor device of claim 1, wherein the metal ring is in the shape of a rectangle, each side of which runs parallel to a corresponding side of the semiconductor die.

7. The semiconductor device of claim 1, wherein the fixed potential is ground.

8. The semiconductor device of claim 1, wherein the semiconductor die is mounted on a die flag.

\* \* \* \* \*